(12) United States Patent
Kalayjian et al.

(10) Patent No.: US 9,257,825 B2
(45) Date of Patent: Feb. 9, 2016

(54) POWER ELECTRONICS INTERCONNECTION FOR ELECTRIC MOTOR DRIVES

(71) Applicant: Tesla Motors, Inc., Palo Alto, CA (US)

(72) Inventors: Nicholas R. Kalayjian, San Carlos, CA (US); Joshua Willard Ferguson, Alameda, CA (US); Benjamin D. Dettmann, San Francisco, CA (US); Ryan C. Kroeze, San Jose, CA (US); Michael R. Kubba, Mointain View, CA (US); William T. Chi, Mountain View, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 59 days.

(21) Appl. No.: 14/188,483

(22) Filed: Feb. 24, 2014

(65) Prior Publication Data
US 2014/0209344 A1   Jul. 31, 2014

Related U.S. Application Data

(62) Division of application No. 13/149,532, filed on May 31, 2011, now Pat. No. 8,686,288.

(51) Int. Cl.
| | |
|---|---|
| *H02G 5/00* | (2006.01) |
| *H01R 43/00* | (2006.01) |
| *H05K 7/14* | (2006.01) |
| *H01B 13/00* | (2006.01) |
| *H02M 7/00* | (2006.01) |

(52) U.S. Cl.
CPC .............. *H02G 5/00* (2013.01); *H01B 13/0036* (2013.01); *H05K 7/1432* (2013.01); *H02G 5/005* (2013.01); *H02M 7/003* (2013.01); *Y10T 29/4913* (2015.01); *Y10T 29/49174* (2015.01); *Y10T 29/49224* (2015.01)

(58) Field of Classification Search
CPC ... H05K 7/1432; H01B 13/0036; H02G 5/00; H02G 5/005; H02M 7/003; Y10T 29/49224; Y10T 29/4913; Y10T 29/49174
USPC ...... 174/68.2, 72 B, 71 B, 88 B, 99 B, 129 B, 174/133 B, 149 B; 361/611, 624, 637, 639, 361/648, 650, 675, 775; 439/212, 213; 29/592.1, 825, 857
See application file for complete search history.

(56) References Cited

U.S. PATENT DOCUMENTS

| | | |
|---|---|---|
| 5,422,440 A | 6/1995 | Palma |
| 5,995,380 A | 11/1999 | Maue et al. |
| 6,359,331 B1 | 3/2002 | Rinehart et al. |

(Continued)

*Primary Examiner* — Angel R Estrada
*Assistant Examiner* — Dimary Lopez Cruz
(74) *Attorney, Agent, or Firm* — J. Richard Soderberg (57) ABSTRACT

The bus bar includes a first bus bar layer formed of a first generally uniform thickness of a first bus bar conductor; a first dielectric layer overlying a top surface of the first bus bar layer; and a second bus bar layer formed of a second generally uniform thickness of a second bus bar conductor overlying a top surface of the first dielectric layer and the top surface of the first bus bar layer wherein: the first bus bar layer includes a first via for receipt of a first electrical lead of an electrical component and a second via for receipt of a second electrical lead of the electrical component and wherein: the first dielectric layer and the second bus bar layer each include a via aligned with the first via wherein the first electrical lead is extendable from beneath the first bus bar layer through the first dielectric layer and through the second bus bar layer.

20 Claims, 9 Drawing Sheets

(56) References Cited

U.S. PATENT DOCUMENTS

| | | |
|---|---|---|
| 7,123,123 B2 * | 10/2006 | Isurin et al. .................. 336/200 |
| 7,869,193 B2 | 1/2011 | Nohara et al. |
| 8,054,633 B2 | 11/2011 | Suwa et al. |
| 8,112,853 B2 * | 2/2012 | Yoshinaga et al. ........... 29/25.42 |
| 8,383,939 B2 | 2/2013 | Gotou |
| 2003/0031038 A1 | 2/2003 | Shirakawa et al. |
| 2006/0239050 A1 | 10/2006 | Andersson et al. |
| 2009/0023053 A1 | 1/2009 | Berdichevsky et al. |
| 2010/0090629 A1 | 4/2010 | Tang |
| 2010/0290204 A1 * | 11/2010 | Pal ................................ 361/775 |
| 2011/0221268 A1 * | 9/2011 | Kanazawa et al. ........... 307/10.1 |

* cited by examiner

POWER ELECTRONICS INTERCONNECTION FOR ELECTRIC MOTOR DRIVES

BACKGROUND OF THE INVENTION

The present invention relates generally to formed copper bus bars, and more specifically, but not exclusively, to specialized bus bars and features thereof used to blend power electronics and arrays of semiconductors and other devices typically interconnected on circuit boards into a single hybrid structure.

An electric vehicle (EV) incorporates a hybrid set of technologies throughout its various systems. For example, there is an energy storage system that stores and distributes large amounts of electrical energy. The storage and distribution is controlled using high-performance semiconductor devices for very fast switching to drive an electric motor, among other purposes. There are many well-known challenges to combining these technologies in a single operational circuit.

These challenges include mechanical design and layout of the components, to allow very large currents to be routed and controlled. Bus bars in general are well-known for electrical power distribution. Simply, a bus bar is a thick strip of copper or aluminum that is designed to carry these very large currents and to distribute current to multiple devices within the equipment. It is known to provide flat strips as bus bars due to favorable heat distribution. For example, formed copper bus bars have been used in industry for decades to connect large semiconductor modules to their associated capacitors, DC bus, and output bus. An advantage of a formed bus bar is that it may be adapted to fit into a particular irregular-shaped volume, such as exist inside a propulsion system of an EV.

Similarly it is well-known to use circuit boards to connect and support large arrays of electronic components, including multilayer FR4 type circuit boards. Technologies have been developed to quickly and efficiently assemble and test a wide range of devices and connectors using circuit boards. Conventional solutions do not blend bus bars and circuit boards; they simply provide a bus bar for the high current and one or more separate conventional circuit boards, such as power electronics (e.g., gate drive electronics). Generally these circuit boards are planar and can be difficult to conform to irregularly-shaped volumes.

There are many potential inefficiencies in an EV regarding distribution and conversion of electrical energy. Some of these potential inefficiencies are exacerbated by segregating these functions. For example, current flow creates one or more magnetic fields and these in turn have an associated inductance. Inductance causes a voltage to be generated that is proportional to a rate of change of current in a circuit. For many reasons, inductance is one limitation on fast switching times and reducing inductance generally reduces inefficiencies in an EV circuit, particularly the important propulsion and power storage/distribution circuits. For a conductor having a thickness, a length, and a width, in general inductance is directly related to the thickness and length and inversely related to the width. For a current loop formed by two conduction paths, the inductance is directly related to the length of the paths and to the separation distance between the paths.

What is needed is a specialized formable low inductance high current capacity bus bar blending power electronics and arrays of semiconductors and other devices into a single hybrid structure.

BRIEF SUMMARY OF THE INVENTION

Disclosed is a specialized formable low inductance high current capacity bus bar blending power electronics and arrays of semiconductors and other devices into a single hybrid structure.

The following summary of the invention is provided to facilitate an understanding of some of technical features related to specialized bus bar construction and use, and is not intended to be a full description of the present invention. A full appreciation of the various aspects of the invention can be gained by taking the entire specification, claims, drawings, and abstract as a whole.

Embodiments of the present invention include a bus bar and a method. The bus bar includes a first bus bar layer formed of a first generally uniform thickness of a first bus bar conductor; a first dielectric layer overlying a top surface of the first bus bar layer; and a second bus bar layer formed of a second generally uniform thickness of a second bus bar conductor overlying a top surface of the first dielectric layer and the top surface of the first bus bar layer wherein: the first bus bar layer includes a first via for receipt of a first electrical lead of an electrical component and a second via for receipt of a second electrical lead of the electrical component and wherein: the first dielectric layer and the second bus bar layer each include a via aligned with the first via wherein the first electrical lead is extendable from beneath the first bus bar layer through the first dielectric layer and through the second bus bar layer.

The method includes the steps of: a) forming a first bus bar layer into a desired three-dimensional form factor, the first bus bar layer formed of a first generally uniform thickness of a first bus bar conductor; b) overlying a first dielectric layer over a top surface of the first bus bar layer; and c) forming a second bus bar layer conforming to the desired three-dimensional form factor, the second bus bar layer formed of a second generally uniform thickness of a second bus bar conductor overlying a top surface of the first dielectric layer and the top surface of the first bus bar layer wherein: the first bus bar layer includes a first via for receipt of a first electrical lead of an electrical component and a second via for receipt of a second electrical lead of the electrical component and wherein: the first dielectric layer and the second bus bar layer each include a via aligned with the first via wherein the first electrical lead is extendable from beneath the first bus bar layer through the first dielectric layer and through the second bus bar layer.

Embodiments of the present invention include one or more of a collection of features allowing a formed copper bus bar structure to be designed into an electric motor drive and the like. Prior implementations of a motor drive have not used a formed copper structure for connection of multiple discrete semiconductor devices with power electronics devices, such as, for example, a DC-Link and/or a snubber capacitor, gate drive reference voltages, DC bus connection, phase output connection, and the like. The included features make the use of the formed structure possible in a volume manufacturing environment and with very high performance.

Losses associated with interconnect resistance can be significantly reduced as are bus inductance(s). Lower bus inductance results in lower switching related losses in the semiconductors, and more importantly it reduces the voltage induced on the DC bus due to inductance-induced overshoot. Lower voltage overshoot allows the use of the most efficient semiconductor devices. The bus bar structures of the preferred embodiments are not required to be flat like conventional PCB assemblies, allowing for mounting flexibility in a semiconductor to heatsink interface.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Embodiments of the present invention provide a specialized formable low inductance high current capacity bus bar blending power electronics and arrays of semiconductors and other devices into a single hybrid structure. The following description is presented to enable one of ordinary skill in the art to make and use the invention and is provided in the context of a patent application and its requirements. In the following text, the terms "energy storage assembly," "battery," "cell," "battery cell," "battery cell pack," "electrolytic double-layer capacitor," and "ultracapacitor" may be used interchangeably (unless the context indicates otherwise" and may refer to any of a variety of different rechargeable configurations and cell chemistries including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other chargeable high energy storage type/configuration.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
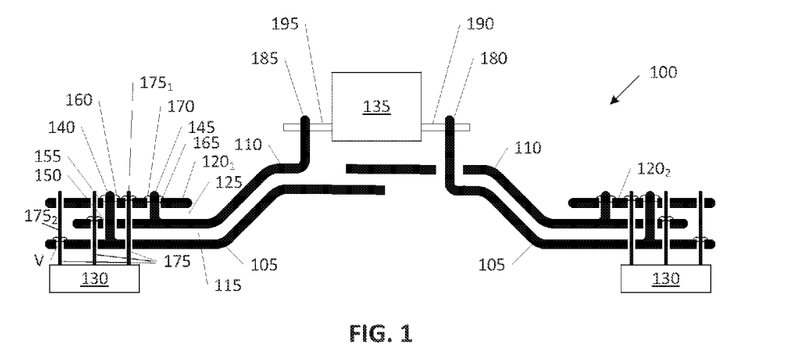
FIG. 1 illustrates a block schematic representation of an end-view of an exemplary bus bar implementation.

FIG. 1 illustrates a block schematic representation of an end-view of a bus bar 100. Bus bar 100 includes a plurality of bus bar layers, including a first bus bar layer 105 and a second bus bar layer 110. Interposed between each bus bar layer is an electrically insulating dielectric, for example, a dielectric layer 115. Bus bar 100 illustrates two bus bar layers for purposes of simplifying explanation of manufacture and use. However, the present invention is not so limited and other numbers of bus bar layers may be used without departing from the scope of the present invention. Each bus bar layer (e.g., layer 105 and layer 110) is preferably as wide, thick and short as reasonable for the application and made from a formed bus bar material (e.g., copper, aluminum, or the like). Dielectric layer 115 includes a film of polyester, Kapton, and the like that provides an insulating laminate layer appropriate for the voltage and current carried by the bus bar layers. Dielectric layer 115 is as thin as possible while providing the insulating function in order to reduce inductance due to currents in the bus bar layers. For example, each bus bar layer is about 0.5 mm thick having a separation of about 0.05 mm, though a wide range of thicknesses are encompassed by the scope of the present invention. Bus bar 100 thus provides a high current capacity, low-inductance multilayer conducting foundation structure. Components are physically mounted to, and electrically intercoupled by, the foundation structure to provide the desired bus bar 100.

Bus bar 100 includes one or more optional printed circuit board assemblies (PCBA) 120 appropriate for some implementations as further explained herein. PCBA 120 is physically coupled to the bus bar layers and preferably is separated from the bus bar layers by a dielectric layer 125. The bus bar layers, the dielectric layers, and the PCBAs are provided with various vias and connection tabs for power and signal interconnections and for permitting electrical leads of the various components and devices to pass therethrough (and at certain points the leads and connection tabs are electrically fused to the bus bar layers and/or the PCBAs). The following description is provided to illustrate representative connection elements and methods used by preferred embodiments of the present invention and does not necessarily directly represent an actual bus bar 100.

For example, a plurality of transistors 130, circuits, and components are integrated into each PCBA 120, and a large power component 135 (for example a DC-Link or snubber capacitor or the like) is interconnected to form representative bus bar 100. A first bus bar connection tab 140 is made from a portion of first bus bar layer 105 and a second bus bar connection tab 145 is made from a portion of second bus bar layer 110.

A first via 150 is provided in second bus bar layer 110 and a second via 155 is provided in PCBA $120_1$ permitting connection tab 140 to extend from first bus bar layer 105 into and through PBCA $120_1$ and the intermediate bus bar and dielectric layers (note vias in the dielectric layers are not expressly called out in the figures). Connection tab 140 is then electrically fused (e.g., solder joint, ultrasonic weld, press fit or the like to make a low-resistance, high mechanical strength electrical contact) to PCBA $120_1$. Similarly, a third via 165 is provided in PCBA $120_1$ permitting second connection tab 145 to extend from second bus bar layer 110 into a through PCBA $120_1$. By use of the connection tabs, voltages and/or currents from the bus bar layers are provided to the PCBAs. For example, first connection tab 140 may provide a first reference voltage available from first bus bar layer 105 to PCBA 120₁ and second connection tab 145 may provide a second reference voltage available from second bus bar layer 110 to PCBA 120₁.

Similarly, leads 175 from component 130 extend into and through various ones of the bus bar layers and PCBAs using aligned vias and selective electrical fusings to connect each lead as desired to the bus bar layers and/or the circuit(s) and component(s) of the PCBAs. For example, lead 175₁ is fused to PCBA 120₁ while lead 175₂ is fused to first bus bar layer 105, for example. One reason that the preferred embodiments of the present invention provide for efficient use of PCBAs is that the manufacturing techniques for manufacture of such structures is well-known and efficiently incorporates small components, surface mount technologies, and other manufacturing processes. Additionally, there are effective testing methodologies that there are cost and time effective recommending their use when appropriate in the context of a hybrid power electronic circuit, such as those used in power converters for EVs and the like, but implemented in a way that preserves the low-inductive coupling advantages of the bus bar structure.

Bus bar structure 100 not only provides electrical coupling of components and devices, such as with components 130, but also mechanical mounting for PCBA 120. For relatively small and low mass devices like gate drive circuits, mechanical mounting requirements are not particularly stringent. Components 130 may be mounted under first bus bar layer 105 (with any necessary or dielectric layer therebetween) and leads extending upwards and through the various layers. Conventional mounting techniques are able to adequately address securely mounting the devices to resist the operational vibrations and mechanical shocks that occur during operation of the EV.

However, for large mass components, particularly components that operate with high currents that are rapidly switched, the preferred embodiment implements a special mechanical and electrical mounting system. Component 135 represents just such a device and is mechanically mounted, and electrically intercoupled, to the bus bar foundation using a first plurality of mounting tabs 180 and a second plurality of mounting tabs 185 (FIG. 2 and FIG. 3 further help illustrate the configuration and arrangement of the plurality of the mounting tabs). Component 135 includes a first set of connection studs 190 having a first polarity (for a DC-Link capacitor example) and a second set of connection studs 195 having a second polarity.

Mounting tabs 180 are formed from first bus bar layer 105. A tab periphery is defined in layer 105 and that portion of layer 105 is bent out of a plane defining layer 105 so that tabs 180 extend generally perpendicularly to the surface of bus bar layer 105, (Note, the void shown in layer 105 under component 135 represents that portion of bus bar layer 105 used in defining the first mounting tabs 180.) Similarly, mounting tabs 185 are formed from second bus bar layer 110. A tab periphery is defined in layer 110 and that portion of layer 110 is bent out of a plane defining layer 110 so that tabs 185 extend generally perpendicularly to the surface of bus bar layer 110 (and generally parallel to tabs 180). (Note, the void shown in layer 110 under component 135 represents that portion of bus bar layer 105 used in defining the first mounting tabs 180.) Mounting tabs 180 and mounting tabs 185 preferably extend to the same height, therefore the underlying set of tabs 180 are actually longer and use more of first bus bar layer 105 than tabs 185 use of second bus bar layer 110. Thus the void for tabs 185 is shown smaller than the void for tabs 180. Additionally mounting tabs 180 pass through complementary apertures in second bus bar layer 185 to permit tabs 180 to extend from below layer 110 to above layer 110.

Figure 2:
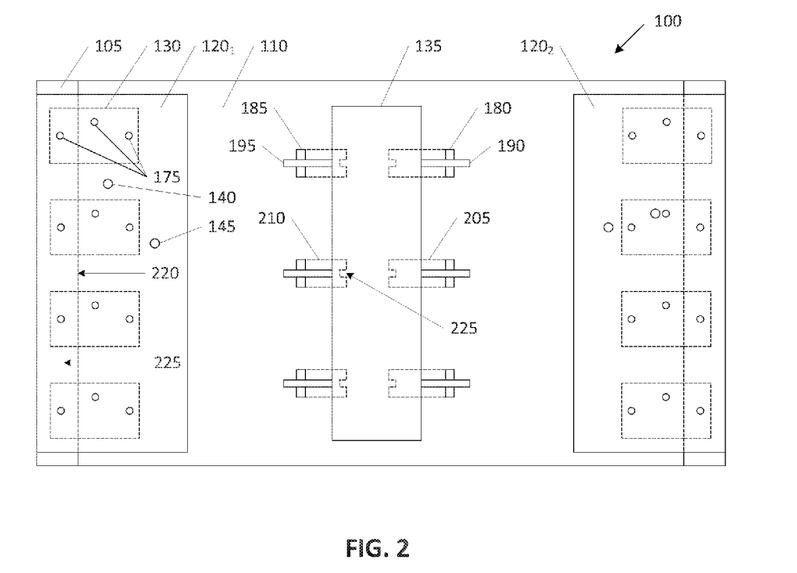
FIG. 2 illustrates a block schematic representation of a top view of the bus bar of FIG. 1.
Figure 3:
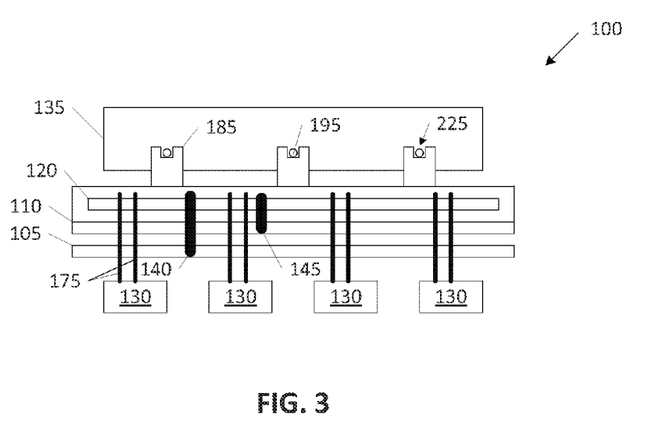
FIG. 3, illustrates a block schematic representation of a side view of the bus bar of FIG. 1.

FIG. 2 illustrates a block schematic representation of a top view of the bus bar 100 of FIG. 1 and FIG. 3 illustrates a block schematic representation of a side view of bus bar 100 of FIG. 1. As better visualized in FIG. 2, a representative bus bar 100 includes four transistors 130 (or other devices, numbers are variable) on each side of component 135, with component 135 including three first polarity connection studs 190 physically mounted to three mounting tabs 180 and three second polarity connection studs 195 physically mounted to three mounting tabs 185, (The present invention encompasses differing numbers of devices, components, studs, and tabs.) The number and arrangement of each type of connection stud serves to reduce the effective current loop, and thus the inductance, between component 135 and the set (or sets) of transistors 130 on each side. Typically one or more of first polarity connection studs 180 and second polarity connection studs 185 are coupled to one or more leads 175 of each device 130 (the connection studs are electrically communicated to a terminal of the capacitor for example). Thus there is an inductance-inducing current flow between one or more connection studs and each transistor 130 and distribution of the plurality of connection studs of each polarity type over the length of component 135 reduces the effective length of this current flow, reducing the inductance. Optimizing a number of connection studs, and thus the number of matching mounting tabs, varies for each implementation.

One consideration is that mounting tabs 180 and mounting tabs 185 not only provide electrical coupling into the bus bar layers, but they also physically secure the relatively large mass component 135 to bus bar 100. The various vibrations and mechanical shocks experienced during operation of an EV require special consideration to properly secure component 135. Generally the more mounting tabs, the more secure component 135, which has an attendant benefit of shortening possible current paths between a lead 175 of any given transistor 130 and a corresponding connection stud 180/185. However, as each mounting tab is formed from a portion of a corresponding bus bar layer, the more mounting tabs may interfere with the bus bar structure and operation as bus bar material is effectively removed.

For example, each mounting tab 180 is shaped from a periphery 205 defined in first bus bar layer 105 and bent upwards and through second bus bar layer 110. Similarly, each mounting tab 185 is shaped from a periphery 210 defined in second bus bar layer and bent upwards generally parallel to corresponding mounting tabs 180. Alternatively, tab 180 could be formed separately and attached (e.g., spot welding or the like) to layer 105. An advantage of an approach like this is to reduce the size of openings in layer 105.

To help physically secure component 135 to the mounting tabs, preferably a coupling system (not shown) is attached to the connection studs, securing component 135 in place. For example, each connection stud 190/195 may be threaded and the coupling system could use complementary nuts and lock washers when physically and electrically coupling component 135 to mounting tabs 180/185. As a further aid in mounting and securing component 135 to bus bar 100, each mounting tab 180/185 includes a fork or "U" shaped slot 225 sized to receive such a connection stud.

As an aid in automating assembly and electric fusing (e.g., use of automatic soldering machines) of leads 175 of devices 130, the bus bar layers are tiered. In other words, an edge 220 of second bus bar layer 110 is not fully overlying first bus bar layer 105 which exposes a portion 225 of first bus bar layer 105. Before PCBAs 120 are mounted, it is easier for a solder machine to access a via V (and lead 175$_2$) extending through first bus bar layer to electrically fuse lead 175$_2$ to first bus bar layer 105 by providing this tiering. Allowing for electrical leads 175$_2$ that are to be electrically fused to first bus bar layer 105 to be routed through portion 225 simplifies the assembly of bus bar 100. In the case of more than two bus bar layers, each layer may be similarly tiered and leads to be fused for any given layer are fused in each exposed portion.

Figure 4:
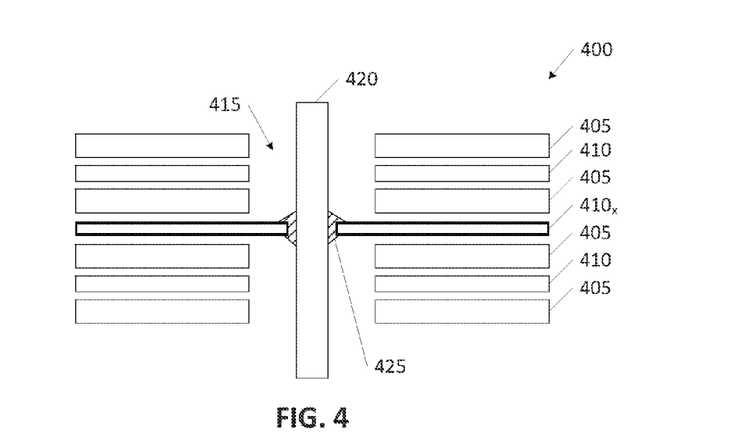
FIG. 4 illustrates a block schematic representation of an expanded side view of a device lead fusing within the bus bar of FIG. 1.
Figure 5:
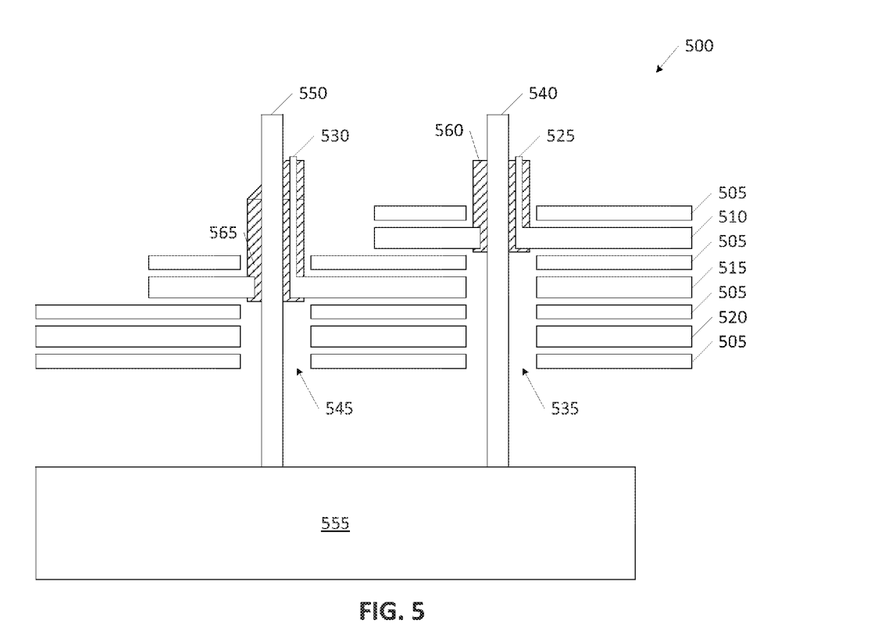
FIG. 5 illustrates a block schematic representation of an expanded side view of an alternative device lead fusing within the bus bar of FIG. 1.
Figure 6:
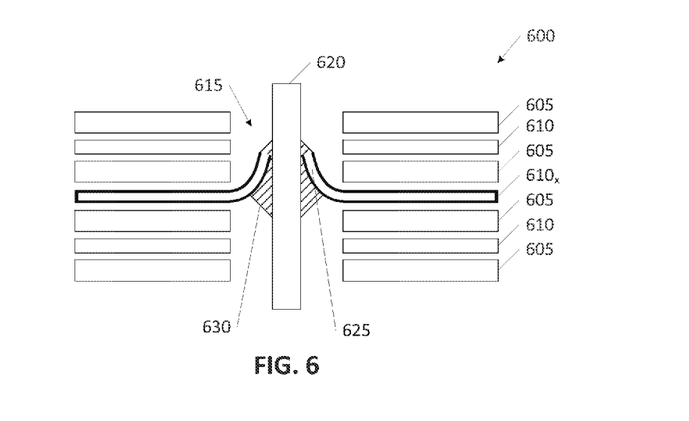
FIG. 6 illustrates a block schematic representation of an expanded side view of another alternative device lead fusing within the bus bar of FIG. 1.

As noted above, electric fusing (e.g., soldering is selectively performed between leads, connection tabs, and various layers and PCBAs. Because of the thickness of an assembled multilayer bus bar 100, it can be difficult to make use of conventional soldering equipment when fusing a lead or connection tab to a bus bar layer and/or a PCBA. FIG. 4 through FIG. 6 help explain aspects of the present invention addressing such fusing in the context of multilayer bus bar 100.

FIG. 4 illustrates a block schematic representation of an expanded side view of a device lead fusing within a portion 400 of a three bus bar layer version of bus bar 100 shown in FIG. 1. As noted herein, bus bar 100 may have virtually any number of bus bar layers. FIG. 1 through FIG. 3 presented bus bar 100 having two bus bar layers to simplify visualization of certain aspects of the present invention. For a power converter used in an EV, bus bar 100 includes three bus bar layers, therefore the remaining figures will use this preferred implementation in detailing other aspects of the present invention.

Portion 400 includes alternating layers of dielectric 405 and bus bar conductor 410 with a via 415 passing through all layers to permit an electrical lead 420 to pass therethrough. One of the bus bar conductor layers, e.g., layer 410$_x$, is selected for fusing to lead 420. An electric fusing 425 (e.g., a solder joint) is installed to electrically communicate lead 420 to bus bar conductor layer 410$_x$. As can be seen in FIG. 4, soldering lead 420 to any bus bar layer, particularly middle layer 410$_x$, is a challenge because the lamination/assembly height of portion 400 limits access to layer 410$_x$ where fusing 425 is to be applied. When soldering, it is common to first apply heat directly to layer 410$_x$ and lead 420 in the vicinity where fusing 425 is to be applied, and automatic soldering machines include a probe or the like to directly heat these elements. It is undesirable to heat too wide an area or to raise the temperature of the elements too high during this process. While a fusing solution such as shown in FIG. 4 may be acceptable in some implementations, fusing 425 between a flat sheet 410$_x$ and lead 420 may be weak. The weakness may be in both physical strength and quality of electrical conductivity. As noted herein, for preferred applications like an EV in which there can be sustained vibrations and occasional mechanical shocks, it is desirable to improve mechanical resistance to failure modes arising from these stressors.

One way to improve the mechanical and electrical quality of fusing 425 is to provide a formed feature in the bus bar layer near the via where the fusing is to be applied. FIG. 5 and FIG. 6 provide representative formed features to promote improved mechanical and electrical couplings.

FIG. 5 illustrates a block schematic representation of an expanded side view of an alternative device lead fusing system within a portion 500 of a three layer bus bar 100. Portion 500 includes a plurality of insulating dielectric layers 505 with a first bus bar layer 510, a second bus bar layer 515, and a third bus bar layer 520. An example of the tiered structure referenced above is illustrated in the context of a three bus bar layer structure. A first electrical communication tab 525 is formed from first bus bar layer 510 and a second electrical communication tab 530 is formed from second bus bar layer 515. Tab 525 and tab 530 are formed features and preferably are formed from the bus bar layer itself. A first via 535 receives a first electrical lead 540 and a second via 545 receives a second electrical lead 550 from an electronic device 555. A first electrical fusing 560 is installed in via. 535 to electrically communicate first lead 540 to first bus bar layer 510 and a second electrical fusing 565 is installed in via 545 to electrically communicate second lead 550 to second bus bar layer 515. The fusings 560 and 565 may provide very large electrical communication areas (e.g., as shown) to the leads with the fusings extending a significant distance above the relevant bus bar layer. Other implementations may be configured differently from that disclosed and include greater or lesser communication areas.

Tab 525 and tab 530 help to permit direct heating of the respective bus bar layer when installing the respective fusing. A heating probe contacts and heats the tabs which in turn rapidly heats the bus bar layers in the location where the fusing is to be installed, without overheating surrounding structures and components/devices. These tabs can, when desirable, permit ultrasonic welding of a respective lead to the respective tab for a different electric fusing process within the scope of the present invention.

If necessary or desirable, such as if device 555 had an additional lead to be coupled to third bus bar layer 520 or to an overlying PCBA (not shown), additional vias and/or electrical communication tabs may be provided as appropriate in portion 500.

FIG. 6 illustrates a block schematic representation of an expanded side view of another alternative device lead fusing system within a portion 600 of a three layer bus bar 100. Portion 600 includes alternating layers of dielectric 605 and bus bar conductor 610 with a via 615 passing through all layers to permit an electrical lead 620 to pass therethrough. One of the bus bar conductor layers, e.g., layer 610$_x$, is selected for fusing to lead 620. A formed structure 625 (e.g., a conical pierce or the like) is provided in bus bar conductor 610$_x$ to facilitate installation of an electrical fusing 630 (e.g., a solder joint or the like). Electric fusing 635 is installed to electrically communicate lead 620 to bus bar conductor layer 610$_x$. Some details of structure 625 are not shown to scale and may be implemented differently from that shown. For example, the formed structure may not necessarily be installed on multiple sides of via 615. Further, one or more elements of structure 625 may be longer than shown, and in some cases come closer to a surface or in still other instances extend outside via 615.

While the formed structures of FIG. 5 and FIG. 6 improve mechanical access to automatic fusing equipment, the fusings installed with these preferred implementations are larger and provide improved strength. Advantageously, by proper design and implementation, these formed structures, particularly formed structure 625 offer improvements in assembly. Some implementations of bus bar 100 will include many devices each having two to three (or more) leads, all of which are mounted into and through appropriate vias in the various layers. Structure 625 aids in the assembly by helping to guide each lead into its respective via by centering the lead in the via as it is installed.

Figure 7:
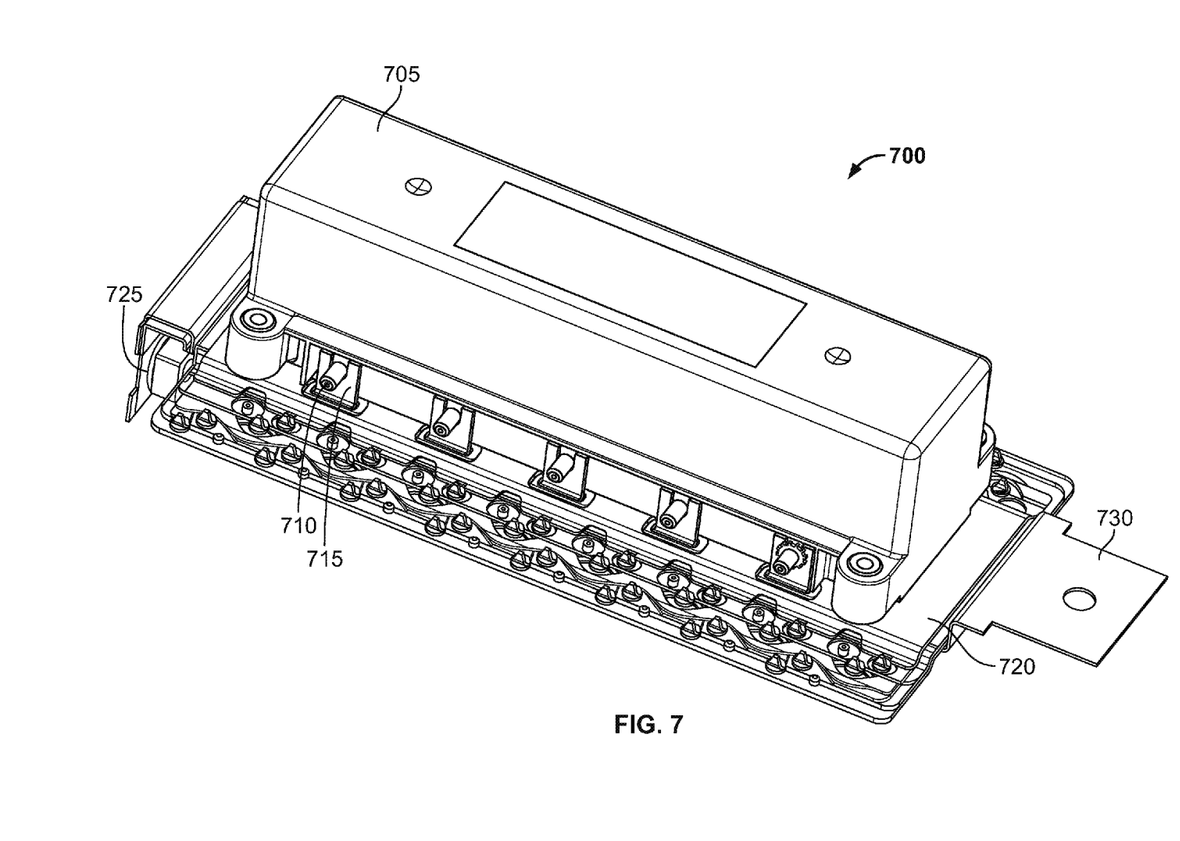
FIG. 7 illustrates an assembled bus bar using a DC-Link capacitor mounting system.

FIG. 7 illustrates an assembled bus bar 700 using a DC-Link capacitor mounting system. Bus bar 700 includes a DC-Link capacitor 705 having a plurality (e.g., five) connection studs 710 of a first polarity coupled to a corresponding number of fork-shaped mounting tabs 715. (Not shown hut provided on the "back" side of FIG. 7 are a second plurality (e.g., five) connection studs of a second polarity coupled to a corresponding number of fork-shaped mounting tabs.) As shown in FIG. 1 through FIG. 3, the mounting tabs are formed from one of the bus bar layers of a multilayer tiered bus bar structure 720. Structure 720 supports a plurality of switching power transistors and intercouples them as well as drive electronics on one or more PCBAs (not shown in FIG. 7) to provide an inverter for one phase of a three-phase electric propulsion motor for the EV. Thus in an actual EV, there are three installations of bus bar 700. Bus bar 700 includes a first connector system 725 (not completely detailed in FIG. 7) for connection to the energy storage system (ESS), such as the main energy storage battery. A second connector system 730 includes a pair of parallel, insulated conductive extensions from two of the bus bar layers. The second connector system 730 is coupled to the assembled bus bars for the other phases and is further detailed in FIG. 11 and FIG. 12.

As noted above, connection of bus bar structure 720 to DC-Link capacitor 705 in an inverter system preferably is done in a way that desirably reduces the bus inductance to close to the lowest possible value. Assembled bus bar 700 provides capacitor 705 with a set of capacitor terminals (i.e., mounting tabs 715), oriented along the bus structure with vertical tabs. Capacitor 705 is connected using screws, solder, ultrasonic welding or the like. A key element of this system includes use of multiple tabs to reduce the inductance (e.g., by reducing a length of current loops between capacitor 705 and other circuit elements of bus bar 700), and the placement of capacitor 705 directly on a top surface of structure 720.

Figure 8:
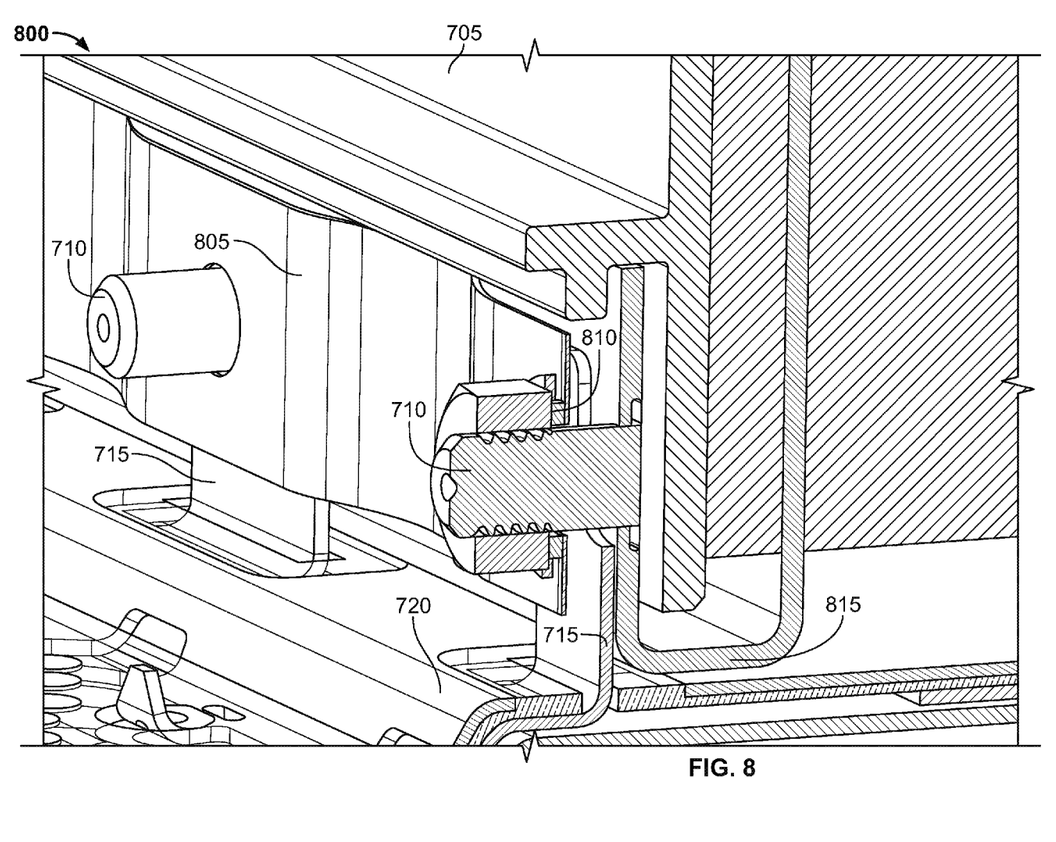
FIG. 8 illustrates details of DC-Link capacitor mounting system shown in FIG. 7.

FIG. 8 illustrates details of a DC-Link capacitor mounting system 800 for capacitor 705 shown in FIG. 7. System 800 includes a biasing system 805 (e.g., a wave spring or the like) installed on connection studs 710 of capacitor 705 prior to assembly of capacitor 705 on bus bar structure 720. Connection nuts and washers 810 are pre-installed on each connection stud 710 coupled to a capacitor terminal 815. Biasing system 805 maintains installation space behind nuts and washers 810 (e.g., between the wave spring and a body of capacitor 705) sufficient to receive mounting tabs 715 with biasing system 805/nuts and washers 810 installed. By this expedient, it is possible to quickly and accurately assemble capacitor 705 onto structure 720. Biasing system 805 holds the washer on the outboard side of the connection and spaced for toot-less mounting. After mounting, the nuts are tightened, pressing the washer against the biasing system which in turn secures capacitor 705 to mounting tabs 715. When a wave spring or the like is used as part of biasing system 805, the resulting structure has a larger contact area and therefore a lower resistance connection to mounting tabs 715 than is the case when washers are used atone.

Figure 9:
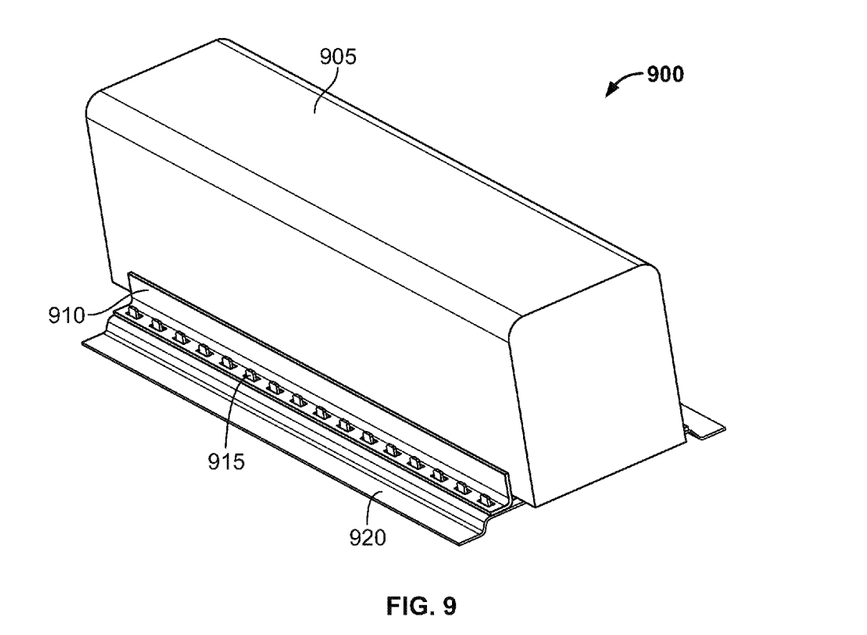
FIG. 9 illustrates an alternative DC-Link capacitor mounting system.

FIG. 9 illustrates an alternative assembled bus bar 900 using an alternative DC-Link capacitor mounting system from that shown above, for example in FIG. 7 and FIG. 8. Bus bar 900 includes a DC-Link capacitor 905 having a first connection terminal 910 with a plurality (e.g., many) connection apertures associated with a first polarity of capacitor 905. (Not shown but provided on the "back" side of FIG. 9 is a second connection terminal with a plurality of connection apertures associated with a second polarity of capacitor 905. A first plurality of bus bar tabs 915 complementary to the connection apertures in terminal 910 are formed from one of the bus bar layers of a multilayer tiered bus bar structure 920 similarly to the mounting tabs referenced above. Electric fusing (e.g., soldering or the like) of terminal 910 to bus bar tabs 915 mechanically secures and electrically communicates capacitor 905 to bus bar structure 920.

Figure 10:
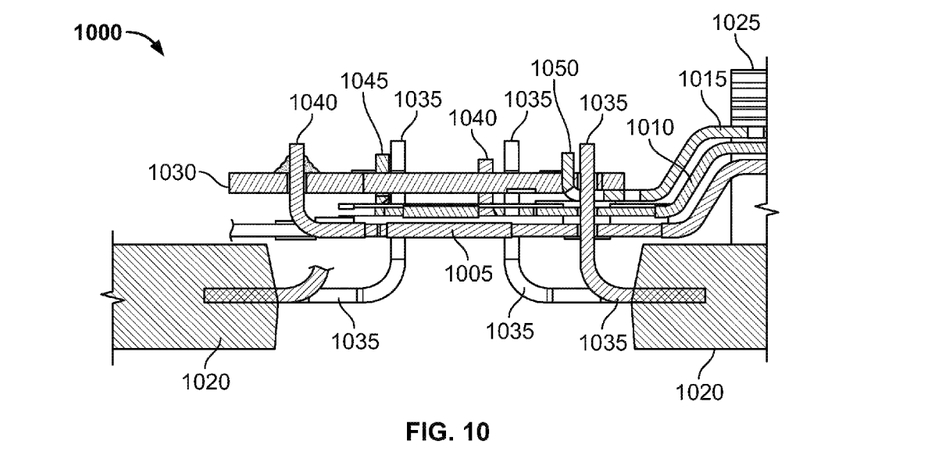
FIG. 10 illustrates a detailed view of a bus bar, such as shown in FIG. 1, including a printed circuit board and semiconductor devices electrically communicated to the bus bar.

FIG. 10 illustrates a detailed view of a bus bar portion 1000 of an assembled tiered three conductive layer bus bar, a variant of bus bar 100 such as shown in FIG. 1. Bus bar portion 1000 includes three laminated insulated bus bar layers (first layer 1005, second layer 1010, and third layer 1015) interconnecting a plurality of transistors 1020 and a DC-Link capacitor 1025 to each other as well as to a PCBA 1030. Each bus bar layer includes a bus bar connection tab (e.g., a first connection tab 1040 for first bus bar layer 1005, a second connection tab 1045 for second bus bar layer 1010, and a third connection tab 1050 for third bus bar layer 1015). A plurality of leads 1035 of transistors 1020 and the connection tabs are variously coupled to and electrically fused with the bus bar layers and/or PCBA 1030. Portion 1000 includes three different types of connections used in implementing preferred embodiments of the present invention. These types of connections include: a) transistor lead 1035 to a bus bar layer, b) transistor lead 1035 to PCBA 1030, and c) a bus bar layer to PCBA 1030.

Connection type c) is one of the enablers of preferred embodiments of the present invention in which one or more PCBAs are integrated into a bus bar structure. For example in the case of an inverter for an EV, gate drive electronics for control of the switching devices (e.g., transistors 1020) are located directly on a top surface of the bus bar assembly (shown as PCBA 1030). Reference voltages of the gate drive electronics may be connected to one of more device leads (e.g., 1035), or to a formed tab or tabs built from one or more of the bus bar layers (e.g., tabs 1040, 1045, and 1050). These tabs are electrically fused (e.g., soldered or press fit or the like) into the gate drive electronics incorporated onto PCBA 1030 and provide the necessary reference voltages.

As briefly discussed above, for example in the context of FIG. 7, a typical inverter for an EV uses multiple bus bar assemblies, one assembly for each phase. In an AC induction drive, there are three phases and therefore there typically will be three bus bar structures. Connection of the DC terminals on each phase to a common DC input cable is accomplished by another bus bar structure. This DC supply bus bar structure also works best if it has a very tow inductance. The connection of the supply bus bar to the phase bus bars should be designed to provide the lowest possible inductance as well. A simple bolted connection (e.g., a pair of large mounting bolts side-by-side) does not allow the positive and negative layers of the bus bars to remain close together due to electrical clearance requirements. A solution using a spring clip may be used as shown in FIG. 11 and FIG. 12 to create a high contact pressure connection, without a bolt hole in the bus bars, and in a configuration that maintains the parallel, low inductance quality of the connection.

Figure 11:
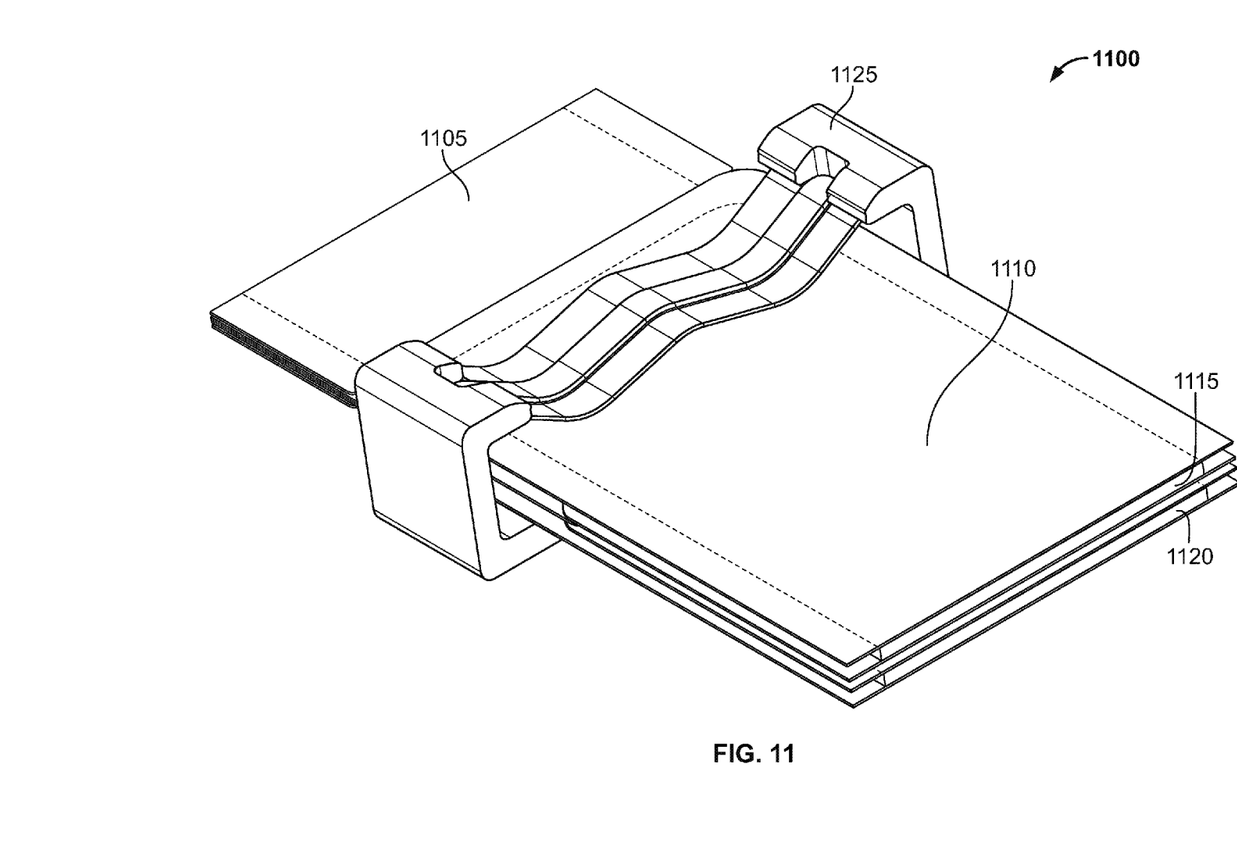
FIG. 11 illustrates a low-inductance bus bar connector system.

FIG. 11 illustrates a low-inductance bus bar connector system 1100. System 1100 includes a connector 1105 from a bus bar assembly, such as assembly 700 shown in FIG. 7, that electrically mates to a complementary connector 1110. As shown in more detail in FIG. 12, connector 1105 provides an extended laminated bus bar structure (low-inductance) with a pair of exposed opposing conducting surfaces. Connector 1110 is also a constructed laminated bus bar structure, preferably having a pair of distinct separate bus bar conductors (e.g., a first coupler 1115 and a second coupler 1120) insulated on one surface and non-insulated on an opposite surface. The bus bar conductors of connector 1110 sandwich connector 1105 therebetween with the conducting surfaces of the structures in engagement. A maintainer 1125 (e.g., a high contact pressure applying spring clip or the like) secures the pair of couplers to connector 1105 to maintain the low inductance connection.

Figure 12:
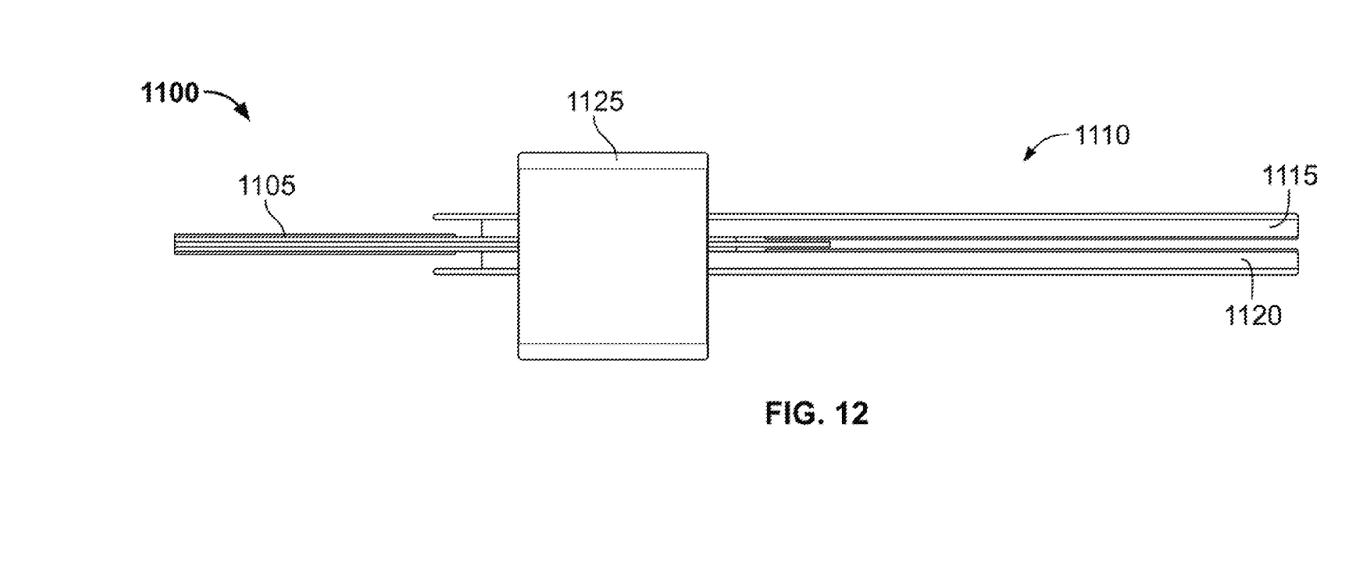
FIG. 12 illustrates details of the bus bar connector system shown in FIG. 11.

FIG. 12 illustrates a side view of bus bar connector system 1100 shown in FIG. 11. As seen in FIG. 12, connector system 1100 is able to optimize a connection between connector 1105 (e.g., part of a bus bar assembly) and connector 1110 (e.g., connected to other phases or elements) by relatively wide, short, and close together couplings which all reduce inductance.

Figure 13:
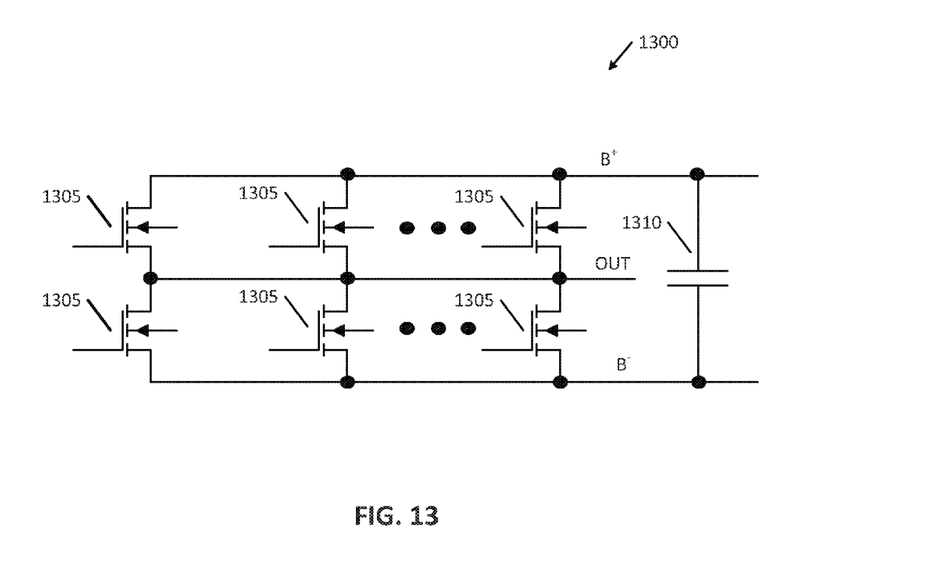
FIG. 13 illustrates a representative schematic diagram of a circuit implemented by a preferred embodiment of bus bar used as one phase of a multiphase drive circuit for an EV.

FIG. 13 illustrates a representative schematic diagram of a circuit 1300 implemented by a preferred embodiment of bus bar assembly such as shown in FIG. 7. A plurality of switching transistors 1305 are coupled together and all share three common voltage reference lines: B+, B−, and OUT. The voltage reference lines each correspond to one bus bar layer, with B+ and B− coupled to terminals of a DC-Link capacitor 1310. Gate drive electronics are included on one or more PCBAs and coupled to the gates of the transistors 1305. Other circuits and arrangements are possible and are included within the scope of the present invention.

As noted herein, the system and process are most preferably implemented in bus bar assemblies used in inverters of AC induction drive systems. The present invention contemplates use in other contexts, which in some instances may incorporate modifications and adjustments to the preferred embodiments disclosed herein. The improved bus bar assembly includes several discrete inventive elements that are protectable by themselves and need not necessarily be combined with or used in cooperation with all the other inventive aspects. The present invention is not limited to AC induction motors and may be applied in many different contexts. For example, permanent magnet motors, such as those used for EV drive, can take advantage of the present invention.

The system and methods above has been described in general terms as an aid to understanding details of preferred embodiments of the present invention. Other preferred embodiments of the present include the described application for a specialized formable low inductance high current capacity bus bar blending power electronics and arrays of semiconductors and other devices into a single hybrid structure. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in tight of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. A bus bar comprising:
   a first bus bar layer formed of a first generally uniform thickness of a first bus bar conductor;
   a first dielectric layer overlying a top surface of said first bus bar layer; and
   a second bus bar layer formed of a second generally uniform thickness of a second bus bar conductor overlying a top surface of said first dielectric layer and said top surface of said first bus bar layer, wherein:
   said first bus bar layer includes a first via for receipt of a first electrical lead of a first electrical component and a second via for receipt of a second electrical lead of said electrical component;
   said first dielectric layer and said second bus bar layer each include a via aligned with said first via wherein said first electrical lead is extendable from beneath said first bus bar layer through said first dielectric layer and through said second bus bar layer;

said second bus bar layer includes a first plurality of electrically conductive mounting tabs formed from said second bus bar layer and extending generally perpendicular to said second bus bar layer and extending away from said first bus bar layer and wherein said first bus bar layer includes a second plurality of electrically conductive mounting tabs formed from said first bus bar layer and extending generally perpendicular to said first bus bar layer and through apertures in said first dielectric layer and said second bus bar layer, with said first and second plurality of electrically conductive mounting tabs extending about an equal distance from a top surface of said second bus bar layer;

said first and second plurality of electrically conductive mounting tabs each include a mounting slot extending generally perpendicular to said second bus bar layer; and each said mounting slot is sized for receiving a respective first and second plurality of connection studs of a DC-Link capacitor of a high-power converter, with said mounting tabs mechanically and electrically supporting said DC-Link capacitor when mounted into said mounting slots using said plurality of connection studs wherein said DC-Link capacitor includes said first plurality of connection studs having a first polarity coupled to said first plurality of electrically conductive mounting tabs and said second plurality of connection studs having a second polarity coupled to said second plurality of electrically conductive mounting tabs.

2. The bus bar of claim 1 wherein the DC-Link capacitor includes said first plurality of connection studs and said second plurality of connection studs, with said first plurality of connection studs mechanically secured to and electrically communicated to said first plurality of mounting tabs and said second plurality of connection studs mechanically secured to and electrically communicated to said second plurality of mounting tabs, and further comprising a second electrical component coupled to a surface of said first bus bar layer not coupled to said first dielectric layer and including said first electrical lead extending through said vias of said first and second bus bar layers and including said second electrical lead extending through said second via of said first bus bar layer, wherein said first electrical lead is electrically fused to said via of said second bus bar layer and wherein said second electrical lead is electrically fused to said second via of said first bus bar layer, wherein said first electrical lead is coupled by said second bus bar layer to said first plurality of connection studs and wherein said second electrical lead is coupled by said first bus bar layer to said second plurality of connection studs.

3. The bus bar of claim 2 further comprising a first plurality of connection couplers engaged with said first plurality of connection studs and a second plurality of connection couplers engaged with said second plurality of connection studs when said DC-Link capacitor is unmounted from said first and second pluralities of electrically conductive mounting tabs and wherein said first and second pluralities of connection couplers are biased away from a body of said DC-Link capacitor by a biasing structure to maintain an installation distance between said connection couplers and said body sufficient to permit said DC-Link capacitor to be mounted into said mounting tabs with said connection couplers installed and without interference of said connection couplers with said mounting tabs when said DC-Link capacitor is installed.

4. The bus bar of claim 3 wherein said biasing structure includes a first wave spring coupled to said first plurality of connection studs and a second wave spring coupled to said second plurality of connection studs.

5. The bus bar of claim 1 wherein a first portion of said first bus bar layer includes said second via and wherein said second bus bar layer does not overlay said first portion of said first bus bar layer.

6. The bus bar of claim 1 wherein said via of said second bus bar layer includes a first electrical communication tab formed from said second bus bar layer and interacting with said first electrical lead when it extends into said via of said second bus bar layer.

7. The bus bar of claim 6 wherein said first electrical communication tab includes a first tab portion extending generally parallel to a longitudinal axis of a portion of said first electrical lead extending through said via of said second bus bar layer, said first tab portion extending above a surface of said second bus bar layer away from said first bus bar layer.

8. The bus bar of claim 7 wherein said first tab portion extends from a periphery of said via of said second bus bar layer towards a center of said via of said second bus bar layer.

9. The bus bar of claim 8 further comprising a second tab portion starting at a point on said periphery and extending towards said center.

10. The bus bar of claim 6 wherein said second via of said first bus bar layer includes a second electrical communication tab formed from said first bus bar layer and interacting with said second electrical lead when it extends into said second via of said first bus bar layer.

11. The bus bar of claim 1 further comprising a second dielectric layer overlying said second bus bar layer, and a printed circuit board assembly (PCBA) overlying said second dielectric layer, wherein said second dielectric layer and said PCBA each include a via aligned with said first via, wherein said first electrical lead is extendable from beneath said first bus bar layer through said dielectric layers, through said second bus bar layer and into and through said PCBA.

12. The bus bar of claim 11 wherein said PCBA includes a bus bar connection via and further comprising a bus bar layer connection tab formed from a portion of one of said first and second bus bar layers with said bus bar layer connection tab engaging said bus bar connection via when said PCBA overlies said first and second bus bar layers.

13. The bus bar of claim 11 wherein said PCBA includes a second via aligned with said second via of said first bus bar layer wherein said second electrical lead is extendable from beneath said first bus bar layer through said first dielectric layer and said PCBA.

14. The bus bar of claim 13 wherein said PCBA includes a bus bar connection via and further comprising a bus bar layer connection tab formed from a portion of one of said first and second bus bar layers with said bus bar layer connection tab engaging said bus bar connection via when said PCBA overlies said first and second bus bar layers.

15. A method comprising:
   a) forming a first bus bar layer into a desired three-dimensional form factor, said first bus bar layer formed of a first generally uniform thickness of a first bus bar conductor;
   b) overlaying a first dielectric layer over a top surface of said first bus bar layer;
   c) forming a second bus bar layer conforming to said desired three-dimensional form factor, said second bus bar layer formed of a second generally uniform thickness of a second bus bar conductor overlying a top surface of said first dielectric layer and said top surface of said first bus bar layer, wherein:

said first bus bar layer includes a first via for receipt of a first electrical lead of a first electrical component and a second via for receipt of a second electrical lead of said electrical component;

said first dielectric layer and said second bus bar layer each include a via aligned with said first via wherein said first electrical lead is extendable from beneath said first bus bar layer through said first dielectric layer and through said second bus bar layer;

d) forming a first plurality of electrically conductive mounting tabs from said second bus bar layer with said first plurality of electrically conductive mounting tabs extending generally perpendicular to said second bus bar layer and extending away from said first bus bar layer;

e) forming a second plurality of electrically conductive mounting tabs from said first bus bar layer with said second plurality of electrically conductive mounting tabs extending generally perpendicular to said first bus bar layer and extending through a second plurality of apertures in both said first dielectric layer and said second bus bar layer, wherein:

said first and second plurality of electrically conductive mounting tabs extend about an equal distance away from a top surface of said second bus bar layer;

said first and second plurality of electrically conductive mounting tabs each include a mounting slot extending generally perpendicular to said second bus bar layer;

each said mounting slot is sized for receiving a respective first and second plurality of connection studs of a DC-Link capacitor of a high-power converter, with said mounting tabs mechanically and electrically supporting said DC-Link capacitor when mounted into said mounting slots using said plurality of connection studs;

f) mounting the first plurality of connection studs of said DC-Link capacitor having a first polarity to said first plurality of electrically conductive mounting tabs; and g) mounting the second plurality of connection studs of said DC-Link capacitor having a second polarity to said second plurality of electrically conductive mounting tabs.

16. The method of claim 15 further comprising:

h) coupling a second electrical component to a surface of said first bus bar layer opposite a surface coupled to said dielectric layer;

i) extending said first lead through both said first via of said first bus bar layer and said via of said second bus bar layer; and j) extending said second electrical lead through said second via of said first bus bar layer.

17. The method of claim 15 further comprising:

h) engaging, when said DC-Link capacitor is unmounted from said first and second pluralities of electrically conductive mounting tabs, a first plurality of connection couplers with said first plurality of connection studs and a second plurality of connection couplers with said second plurality of connection studs; and i) biasing said pluralities of connection couplers away from a body of said DC-Link capacitor to maintain an installation distance between said connection couplers and said body sufficient to permit said DC-Link capacitor to be mounted into said mounting tabs with said connection couplers installed without interference between said connection couplers and said mounting tabs.

18. The method of claim 17 wherein said biasing uses a biasing structure and wherein said biasing structure includes a first wave spring coupled to said first plurality of connection studs and a second wave spring coupled to said second plurality of connection studs.

19. The method of claim 15 wherein a first portion of said first bus bar layer includes said second via and wherein said second bus bar layer does not overlay said first portion of said first bus bar layer.

20. The method of claim 15 further comprising overlaying a second dielectric layer over said second bus bar layer, and a printed circuit board assembly (PCBA) over said second dielectric layer, wherein said second dielectric layer and said PCBA each include a via aligned with said first via, wherein said first electrical lead is extendable from beneath said first bus bar layer through said dielectric layers, through said second bus bar layer and into and through said PCBA.

* * * * *